(12) United States Patent
Weber

(10) Patent No.: US 7,812,569 B2
(45) Date of Patent: Oct. 12, 2010

(54) CIRCUIT TO MEASURE VEHICLE BATTERY VOLTAGE

(75) Inventor: Charles F. Weber, Dexter, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 285 days.

(21) Appl. No.: 11/016,579

(22) Filed: Dec. 17, 2004

(65) Prior Publication Data
US 2006/0132140 A1 Jun. 22, 2006

(51) Int. Cl.
*H02J 7/00* (2006.01)
(52) U.S. Cl. .................... 320/134; 320/127; 320/129; 324/433
(58) Field of Classification Search ............. 324/522, 324/713, 433, 429, 428, 427, 444, 426; 320/134, 320/127, 129, 130, 131, 135, 136; 702/35, 702/58, 63
See application file for complete search history.

(56) References Cited

U.S. PATENT DOCUMENTS

| | | | | |
|---|---|---|---|---|
| 4,387,350 | A * | 6/1983 | Bessolo et al. ......... 331/116 FE |
| 4,521,735 | A * | 6/1985 | Kageyama et al. .......... 324/433 |
| 4,636,705 | A * | 1/1987 | Bowman ..................... 322/28 |
| 4,956,597 | A * | 9/1990 | Heavey et al. .............. 320/129 |
| 5,136,246 | A * | 8/1992 | Sakamoto ................... 324/433 |
| 5,266,880 | A * | 11/1993 | Newland .................... 320/125 |
| 5,721,688 | A * | 2/1998 | Bramwell .................... 702/63 |
| 5,847,546 | A * | 12/1998 | Sengupta et al. ............ 320/144 |
| 6,091,226 | A * | 7/2000 | Amano ....................... 320/116 |
| 6,243,034 | B1 | 6/2001 | Regier |
| 6,411,068 | B1 * | 6/2002 | Willis ......................... 323/282 |
| 6,982,499 | B1 * | 1/2006 | Kachi et al. ................... 307/75 |
| 7,075,803 | B2 * | 7/2006 | Eberlein ...................... 363/41 |
| 2004/0135551 | A1 * | 7/2004 | Hoff et al. ................... 320/150 |
| 2005/0258814 | A1 * | 11/2005 | Chen et al. ................... 323/285 |
| 2005/0268957 | A1 * | 12/2005 | Enomoto et al. ............ 136/244 |
| 2006/0034449 | A1 * | 2/2006 | Joerger ........................ 379/413 |

FOREIGN PATENT DOCUMENTS

DE 196 05 481 C1 6/1997

OTHER PUBLICATIONS

LM139/LM239/LM339/LM2901/LM3302 Low Power Low Offset Voltage Quad Comparators.*
U. Tietze, Ch. Schenk, Halbleiter-Schaltungs-technik. 10. Auflage, Springer-Verlag, pp. 786-788.

* cited by examiner

*Primary Examiner*—Bao Q Vu
*Assistant Examiner*—Nguyen Tran
(74) *Attorney, Agent, or Firm*—Brinks Hofer Gilson & Lione

(57) ABSTRACT

A system for measuring a battery voltage is provided. The system includes a battery, a time encoding circuit, and a controller. The time encoding circuit is in electrical communication with the battery to receive the battery voltage. The time encoded circuit is configured to generate a time encoded signal corresponding to the battery voltage. The controller is in electrical communication with the time encoding circuit to receive the time encoded signal and configured to determine the battery voltage based on the time encoded signal.

22 Claims, 2 Drawing Sheets

US 7,812,569 B2

CIRCUIT TO MEASURE VEHICLE BATTERY VOLTAGE

BACKGROUND

1. Field of the Invention

The present invention generally relates to a system for measuring battery voltage.

2. Description of Related Art

As power management requirements have increased in the automotive industry, electronics modules have been required to measure the battery voltage with more precision. Typical electronic modules used for battery management include micro-controllers having an 8 or 10 bit A/D converter. However, these converters do not have the precision required for current day battery management. A common solution to the problem is to use an IC separate from the micro-controller having a full range (greater than 10 bits) precision A/D converter and a precision voltage reference. The additional A/D converter and precision voltage reference can add significant cost to the circuit. In addition, the extra IC and supporting circuitry can add significant complexity to the circuit design.

In view of the above, it is apparent that there exists a need for an improved system for measuring battery voltage.

SUMMARY

In satisfying the above need, as well as overcoming the enumerated drawbacks and other limitations of the related art, the present invention provides an improved system for measuring battery voltage.

Although standard automotive micro controllers typically only have 8 or 10 bit A/D converters, most standard micro-controllers include timers that commonly have resolution as high as 16 bits or greater. Therefore, a circuit receives the battery voltage and generates a time encoded signal corresponding to the battery voltage. The circuit is in electrical communication with a controller to provide the time encoded signal to a timer in the controller. The controller includes a transfer function configured to determine the battery voltage based on the time encoded signal.

The time encoding circuit includes a switch, an integrator, and a comparator. The switch is configured to oscillate between the battery voltage and an electrical ground, thereby providing a switch signal to the integrator. The integrator includes an operational amplifier configured to integrate the switch signal creating an integrated signal that is provided to the comparator. The comparator generates a time encoded signal that corresponds to the battery voltage. To increase the range and precision of the comparator, a double positive feedback loop is used. The time encoded signal is also provided to the switch, to control the oscillation of the switch. The controller receives the time encoded signal from the integrator and determines the battery voltage.

While the circuit is used for over a limited range of battery voltages, it is very precise and typically performs within 0.05% over a wide range of temperatures at 14 volts. In addition, the circuit allows for a kelvin connection to the battery to reduce the errors caused by ground and voltage supply drops. The circuit also includes a simple method to put the circuit to sleep to minimize battery drain when the vehicle is parked.

Further objects, features and advantages of this invention will become readily apparent to persons skilled in the art after a review of the following description, with reference to the drawings and claims that are appended to and form a part of this specification.

DETAILED DESCRIPTION

Figure 1:
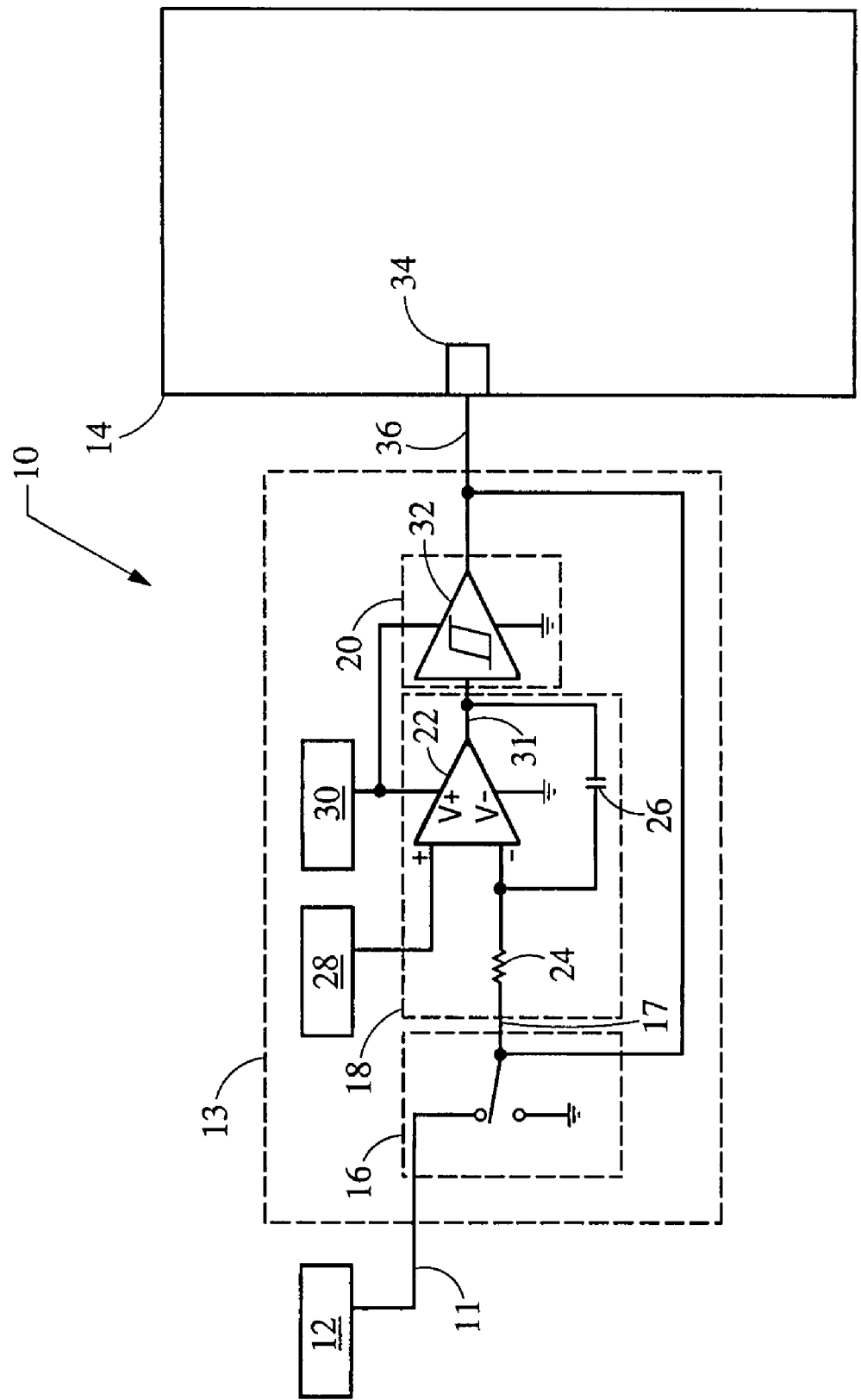
FIG. 1 is a schematic view of a circuit for measuring battery voltage in accordance with the present invention.

Referring now to FIG. 1, a system embodying the principles of the present invention is illustrated therein and designated at 10. As its primary components, the system 10 includes a battery 12, a time encoding circuit 13, and a controller 14. The battery 12 may be a common automotive battery such as a 12 or 48 volt battery. The positive terminal of the battery 12 is connected to the time encoding circuit 13. The time encoding circuit 13 receives the battery voltage 11 and generates a time encoded signal 36 that is provided to the controller 14.

The time encoding circuit 13 includes a switch 16, an integrator 18, and a comparator 20. The switch 16 receives the battery voltage 11 and selectively connects the input of the integrator 18 between the battery voltage 11 and an electrical ground. As such, the switch 16 generates a switch signal 17 that is provided to the input of the integrator 18.

The integrator 18 includes an operational amplifier 22. A negative input of the operational amplifier 22 is connected to a resistor 24 that receives the switch signal 17. A positive input of the operational amplifier 22 is connected to a voltage reference 28. A capacitor 26 is connected between the negative input and the output of the operational amplifier 22, causing the operational amplifier 22 to generate an integrated signal 31. In addition, power is supplied to the operational amplifier 22 by a regulated voltage source 30.

The integrated voltage signal 31 is provided to the comparator 20. The comparator 20 includes an operational amplifier 32 that receives the integrated voltage signal 31. The operational amplifier 32 acts as a threshold detector with hysteresis.

At the start of the cycle, the switch 16 is connected to ground and the integrator 18 integrates the reference voltage 28 until the upper threshold of the comparator 20 is reached. When the upper threshold of the comparator 20 is reached, the comparator output changes state causing the switch 16 to connect to the battery 12 providing the battery voltage 11 to the integrator 18. The integrator 18 integrates the switch signal 17 in combination with the voltage reference 28 until the lower comparator threshold is reached. The integrator 18 integrates the switch signal 17 and voltage reference 28 according to the relationship $V(t) = -\int (V_{sw} - V_{ref}) t\, dt$ where V is the integrated signal 31, $V_{sw}$ is the switch signal 17, and $V_{ref}$ is the reference voltage 28. When the lower comparator threshold is reached, the comparator 20 again changes states and the cycle repeats. The resulting time encoded signal 36 is a pulse train that corresponds to the battery voltage 11 based on the relationship $V_{bat} = V_{ref}(t_{high} + t_{low})/t_{low}$, where $t_{high}$ is the amount of time the time encoded signal 36 is high during a switch cycle, and $t_{low}$ is the amount of time the time encoded signal 36 is low during a switch cycle.

The output of the comparator 20 is provided as feedback and controls the switch 16 in such a way to make the switch 16 oscillate. The controller 14 includes a timer 34 that is configured to receive the time encoded signal 36. Further, the controller 14 is configured to determine the battery voltage 11 by decoding the time encoded signal 36 according to the relationship $V_{bat} = V_{ref}(t_{high} + t_{low})/t_{low}$ where $t_{high}$ is the amount of time the time encoded signal 36 is high during a switch cycle, and $t_{low}$ is the amount of time the time encoded signal 36 is low during a switch cycle.

Figure 2:
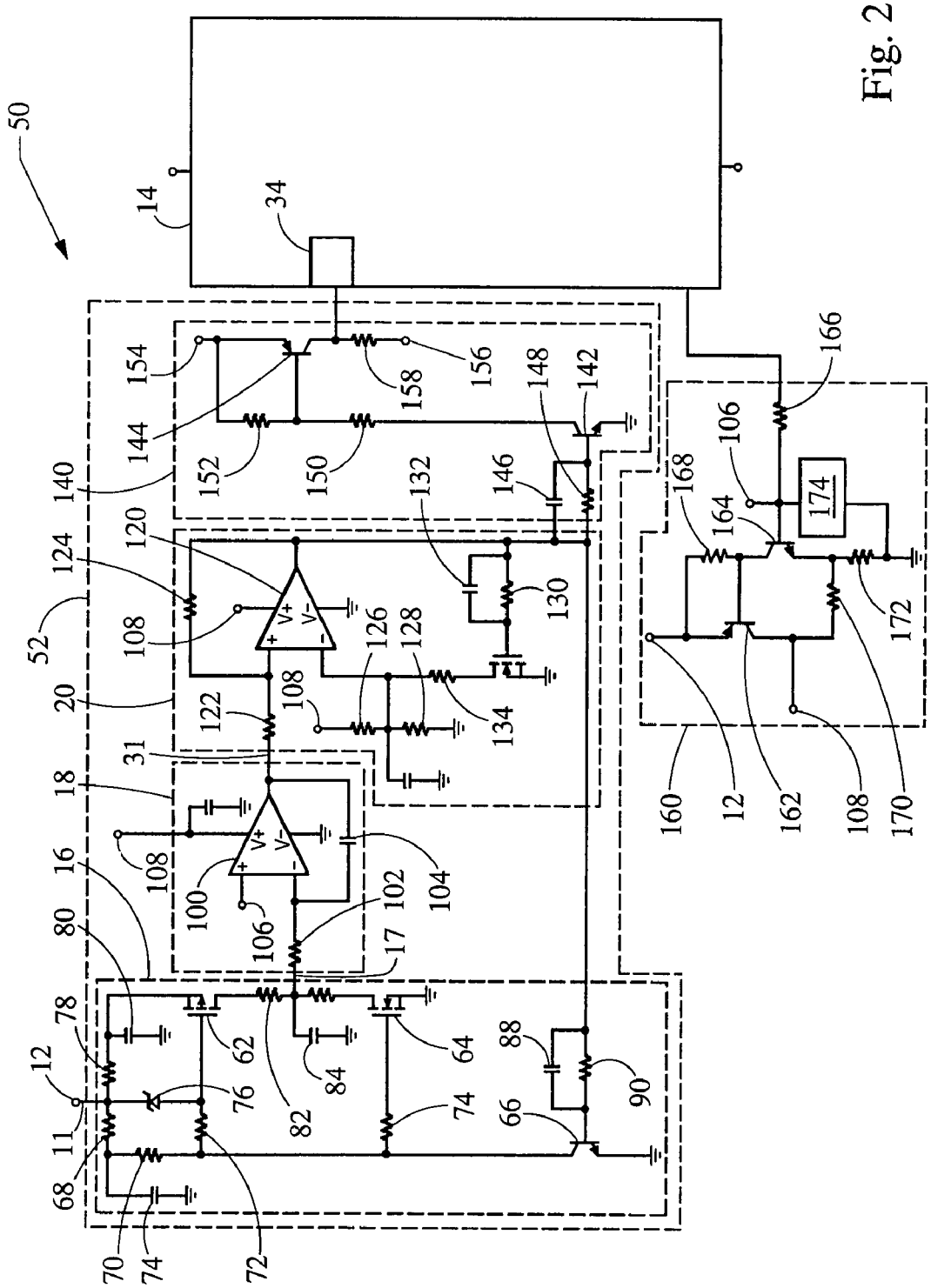
FIG. 2 is a schematic view of another circuit for measuring battery voltage in accordance with the present invention.

Now referring to FIG. 2, a circuit 50 for measuring battery voltage 11 in accordance with the present invention is provided. The circuit 50 includes a battery 12, a time encoding circuit 52 and a controller 14. The battery 12 is connected to a time encoding circuit 52 and provides the battery voltage 11 thereto. The time encoding circuit 52 includes a switch 16, an integrator 18, and a comparator 20. The switch 16 acts like a two position switch selectively connecting the switch output to the battery 12 or electrical ground. The switch 16 includes transistor 62, transistor 64, and transistor 66. Transistor 62 is shown as a p-channel MOSFET. However, other transistors may be readily used. The gate of transistor 62 is connected to the battery voltage 11 through a resistor network including resistor 68, resistor 70, and resistor 72. Further, a filter capacitor 74 is connected on one side between resistor 70 and 68 and on the other side to an electrical ground. A zener diode 76 is also connected in parallel with the resistor network between the gate of transistor 62 and the battery voltage 11, for over voltage protection. The source of transistor 62 is connected to the battery voltage 11 through resistor 78 and filtering capacitor 80 is connected between the source of transistor 62 and electrical ground. The drain of transistor 62 is connected to the integrator 18 through resistor 82. While filtering capacitor 84 is connected between the input of the integrator 18 and an electrical ground.

Transistor 64 is connected to the battery 12 through a resistor network including resistor 68, resistor 70, and resistor 74. Transistor 64 is shown as an n-channel MOSFET. However, other transistors may be readily used. Resistor 74 is connected to the gate of transistor 64, while the drain of transistor 64 is connected to the integrator 18 through resistor 86. The source of transistor 64 is connected to an electrical ground.

Transistor 66 is shown as a PNP bipolar transistor. The collector of transistor 66 is in electrical communication with the battery 12 through resistor 70 and resistor 68. The emitter of transistor 66 is connected to an electrical ground. The base of transistor 66 is connected through capacitor 88 and resistor 90 to the comparator 20 to oscillate the switch 16. In the initial power-on state transistor 66 is non-conducting and no current flows through resistor 70. In this case, both gates of transistors 62 and 64 have battery voltage applied. Transistor 62, being a P-channel FET, is non-conducting since the voltage potential, gate to source, is approximately zero. Transistor 64, being an N-channel FET with source at ground potential, is conducting since the gate to source voltage potential is the required positive value. When the comparator changes state and transistor 66 becomes conducting, current flows through resistor 70. With the collector of transistor 66 near ground potential, the gates of transistors 62 and 64 have ground potential applied. Transistor 62, being a P-channel FET, is now conducting since the voltage potential, gate to source, is approximately battery voltage. Transistor 64, being an N-channel FET with source at ground potential, is non-conducting since the gate to source voltage potential is approximately zero. With transistors 62 and 64 changing state according to the comparator output, the switch output 17 may connect the integrator 18 input to battery and ground connections.

Operational amplifier 100 receives the switched signal 17 through resistor 102 into the negative input of the operational amplifier 100. The capacitor 104 is connected between the negative input and the output of the operational amplifier 100. The positive input of the operational amplifier 100 is connected to a voltage reference 106. Power is provided to the operational amplifier 100 from a power source 108. The resistor 102 and capacitor 104 cause the operational amplifier 100 to integrate the switched signal 17 with respect to the reference voltage such that the integrated signal 31 is based on the relationship $V(t) = -\int (V_{sw} - V_{ref}) t\, dt$.

The integrated signal 31 is provided to the comparator 20 and is received by operational amplifier 120 through resistor 122. Resistor 124 is connected between the positive input and the output of operational amplifier 120 and forms a first positive feedback loop to the positive input of the operational amplifier 120. The negative input of operational amplifier 120 is connected to a voltage divider formed by resistor 126 and resistor 128. The voltage divider provides a voltage reference for the negative input of the operational amplifier 120. In addition, a second positive feedback loop is provided between the output and the negative terminal of operational amplifier 120. The second positive feedback loop includes resistor 130, capacitor 132, resistor 134, and transistor 136. Transistor 136 serves to invert the feedback provided from the output to the negative terminal of operational amplifier 120 thereby forming a positive feedback loop. The output of operational amplifier 120 is connected to the gate of transistor 136 through resistor 130 and capacitor 132. The source of transistor 136 is connected to an electrical ground, while the drain of transistor 136 is connected to the negative input of operational amplifier 120 through resistor 134. The output of the comparator 20 is provided both as feedback to control the switch 16 and to the level shifter 140 which provides the time encoded signal to the controller 14.

The level shifter 140 includes transistors 142 and 144. Transistors 142 and 144 are level shifters that allow the kelvin connection to separate the battery from the controller 14. The output of the comparator 20 is provided to transistor 142 through capacitor 146 and resistor 148. The collector of transistor 142 is in electrical communication with the base of transistor 144 through resistor 150, while the emitter of transistor 142 is connected to an electrical ground. Resistor 152 is connected between the base of transistor 144 and a controller power supply 154. The emitter of transistor 144 is also connected to the controller power supply 154. The collector of transistor 144 is in electrical communication with the controller 14 to provide the time encoded signal 36, and a controller ground 156 through resistor 158.

The controller 14 includes a timer 34 to receive the time encoded signal 36 and to decode the time encoded signal to determine the battery voltage based on the relationship $V_{bat} = V_{ref}(t_{high} + t_{low})/t_{low}$, where $t_{high}$ is the amount of time the time encoded signal 36 is high during a switch cycle, and $t_{low}$ is the amount of time the time encoded signal 36 is low during a switch cycle.

In addition, power circuit 160 is connected to the circuit on/off output of the controller 14 to power up and shut down the time encoded circuit 52 as required for low battery drain. The time encoded circuit 52 may be powered down when the vehicle is shutoff after a period of non-use. The power circuit 160 includes transistor 162 and transistor 164. The circuit on/off output of controller 14 is connected to the base of transistor 164 through resistor 166. The voltage reference 106 is provided by a shunt regulator 174 connected between the base of transistor 164 and an electrical ground. The collector of transistor 164 is connected to the base of transistor 162 and in communication with the battery voltage through resistor 168. The emitter of transistor 164 is in electrical communication with the collector of transistor 162 through resistor 170 and electrical ground through resistor 172. The battery 12 is connected to the emitter of transistor 164 and provides power to the power source 108 through the collector of transistor 162.

As a person skilled in the art will readily appreciate, the above description is meant as an illustration of implementation of the principles this invention. This description is not intended to limit the scope or application of this invention in that the invention is susceptible to modification, variation and change, without departing from the spirit of this invention, as defined in the following claims.

I claim:

1. A system for measuring a voltage, the system comprising:
   a time encoding circuit in electrical communication with the voltage, the time encoding circuit generating a time encoded signal corresponding to the voltage, the time encoding circuit includes a switch, an integrator, and a comparator,
   the switch generating a switched signal based on the voltage, the switch being in communication with the integrator through a first resistor to provide the switched signal, a first side of the first resistor being in communication with the switch and a second side of the first resistor being in communication with the integrator,
   the integrator integrating the switched signal to generate an integrated signal, the integrator being in communication with an input of the comparator to provide the integrated signal, the integrator including a capacitor, a first side of the capacitor being in communication with the input of the comparator and a second side of the capacitor being in communication with the second side of the first resistor,
   the comparator receiving the integrated signal to generate the time encoded signal, a first feedback loop being connected between an output of the comparator and the switch causing the switch to oscillate based on the time encoded signal;
   a controller in electrical communication with the time encoding circuit, the controller being configured to determine the voltage based on the time encoded signal;
   wherein a second feedback loop includes a transistor, the output of the comparator is connected to a gate of the transistor and an output of the transistor is connected to the negative input of the comparator.

2. The system according to claim 1, wherein the controller includes a timer configured to receive the time encoded signal.

3. The system according to claim 2, wherein the timer receives the time encoded signal to decode the time encoded signal based on the relationship $V_{bat}=V_{ref}(t_{high}+t_{low})/t_{low}$ where $t_{high}$ is the amount of time the time encoded signal is high during a switch cycle, and $t_{low}$ is the amount of time the time encoded signal is low during a switch cycle, $V_{bat}$ is the voltage being measured, and $V_{ref}$ is the time encoded signal voltage.

4. The system according to claim 1, wherein the switch includes a first and second transistor, the first transistor being in electrical series connection with the second transistor, the control input of the first and second transistor being in electrical communication with the voltage, and a first conducting terminal being in electrical communication with the voltage, the second transistor having a conducting terminal in electrical communication with electrical ground.

5. The system according to claim 4, wherein the switch includes a third transistor connected between the gate of the first and second transistor and an electrical ground, the control input of the third transistor being in electrical communication with the comparator through the first feedback loop to receive a feedback signal.

6. The system according to claim 4, wherein the feedback signal causes the switch circuit to oscillate.

7. The system according to claim 1, wherein the integrator is configured to integrate the voltage according to the relationship $V(t)=-\int(V_{sw}-V_{ref})t\,dt$, where V is the integrated signal, $V_{sw}$ is a switch signal based on the voltage, and $V_{ref}$ is the reference voltage.

8. The system according to claim 1, wherein the integrator includes an operational amplifier.

9. The system according to claim 8, wherein the operational amplifier has a second resistor connected to a negative input of the operational amplifier and configured to receive the voltage, and the capacitor is connected between the negative input and an output of the operational amplifier, and a voltage reference connected to a positive input of the operational amplifier.

10. The system according to claim 1, wherein the comparator includes an operational amplifier.

11. The system according to claim 10, wherein the operational amplifier includes two positive feedback loops.

12. The system according to claim 10, wherein the operational amplifier includes a resistor connected between a positive input and an output of the operational amplifier.

13. The system according to claim 10, wherein an output of the operational amplifier is connected to a control input of a transistor, and the transistor is in electrical communication with the negative input of the operational amplifier.

14. The system according to claim 13, wherein the transistor is an n-channel MOSFET, and a gate of the transistor is connected to the output of the operational amplifier, the drain of the transistor is connected to an electrical ground, and the source of the transistor is in electrical communication with the negative input of the operational amplifier.

15. The system according to claim 10, wherein the negative input of the operational amplifier is in communication with a voltage divider.

16. The system according to claim 1, further comprising a kelvin connection connected between the comparator and the controller.

17. The system according to claim 1, wherein the controller is configured to control a power circuit to power down the time encoding circuit.

18. The system according to claim 17, wherein the power circuit includes a transistor connected between the voltage and the operational amplifier power supply.

19. The system according to claim 1, wherein substantially all current of the switched signal travels through the capacitor.

20. The system according to claim 1, wherein the time encoded signal based on the relationship $V_{bat}=V_{ref}(t_{high}+t_{low})/t_{low}$ where $t_{high}$ is the amount of time the time encoded signal is high during a switch cycle, and $t_{low}$ is the amount of time the time encoded signal is low during a switch cycle, $V_{bat}$ is the voltage being measured, and $V_{ref}$ is the time encoded signal voltage.

21. A system for measuring a voltage, the system comprising:
   a time encoding circuit in electrical communication with the voltage, the time encoding circuit generating a time encoded signal corresponding to the voltage, the time encoding circuit includes a switch, an integrator, and a comparator,
   the switch generating a switched signal based on the voltage, the switch being in communication with the integrator through a first resistor to provide the switched signal, a first side of the first resistor being in communication with the switch and a second side of the first resistor being in communication with the integrator, the integrator integrating the switched signal to generate an integrated signal, the integrator being in communication with an input of the comparator to provide the integrated signal, the integrator including a capacitor, a first side of the capacitor being in communication with the input of the comparator and a second side of the capacitor being in communication with the second side of the first resistor, the comparator receiving the integrated signal to generate the time encoded signal, a first feedback loop comprising a resistor being connected between an output of the comparator and the switch, the first feedback loop communicating the time encoded signal from the comparator to the switch causing the switch oscillate;

a controller in electrical communication with the time encoding circuit, the controller being configured to determine the voltage based on the time encoded signal;

wherein a second feedback loop is connected between the output of the comparator and a negative input of the comparator, wherein the second feedback loop includes a transistor, the output of the comparator is connected to a gate of the transistor and an output of the transistor is connected to the negative input of the comparator.

22. The system according to claim 21, wherein a third feedback loop is connected between the output of the comparator and a positive input of the comparator.

* * * * *